United States Patent
Gong et al.

(10) Patent No.: US 11,112,898 B2
(45) Date of Patent: Sep. 7, 2021

(54) FORCE TOUCH STRUCTURE, FORCE TOUCH PANEL AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Qing Gong, Beijing (CN); Kwang Gyun Jang, Beijing (CN); Wenxiao Niu, Beijing (CN); Song Ju, Beijing (CN)

(73) Assignees: CHENGDU BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/633,621

(22) PCT Filed: Jan. 9, 2019

(86) PCT No.: PCT/CN2019/070997
§ 371 (c)(1),
(2) Date: Jan. 24, 2020

(87) PCT Pub. No.: WO2020/142933
PCT Pub. Date: Jul. 16, 2020

(65) Prior Publication Data
US 2021/0064168 A1    Mar. 4, 2021

(51) Int. Cl.
*G06F 3/041*      (2006.01)
*G06F 3/044*      (2006.01)
(Continued)

(52) U.S. Cl.
CPC .......... *G06F 3/0412* (2013.01); *G06F 3/0443* (2019.05); *G06F 3/04164* (2019.05);
(Continued)

(58) Field of Classification Search
CPC .. G06F 3/0412; G06F 3/04164; G06F 3/0443; G06F 3/0446; G06F 2203/04105; G06F 2203/04106
See application file for complete search history.

(56) References Cited

U.S. PATENT DOCUMENTS

2017/0010719 A1   1/2017   Chen et al.
2017/0010740 A1*   1/2017   Chuang ................. G06F 3/0414
2019/0004651 A1   1/2019   Hong et al.

FOREIGN PATENT DOCUMENTS

CN    106325579 A    1/2017
CN    206058152 U    3/2017
(Continued)

*Primary Examiner* — Michael Pervan
(74) *Attorney, Agent, or Firm* — Dilworth & Barrese, LLP.; Michael J. Musella, Esq.

(57) ABSTRACT

A force touch structure, a force touch panel and a display device. The force touch panel includes a display array layer and a force touch structure on a display side of the display array layer, the force touch structure includes a force sensing layer and a touch sensing layer that are laminated, the force sensing layer includes a plurality of force sensing electrodes, each of the plurality of force sensing electrodes is configured to change a resistance value upon being pressed, and the touch sensing layer is configured to detect a touch position.

15 Claims, 8 Drawing Sheets

(51) Int. Cl.
*H01L 27/32* (2006.01)
*H01L 51/52* (2006.01)

(52) U.S. Cl.
CPC ........ *H01L 27/323* (2013.01); *H01L 27/3244* (2013.01); *H01L 51/5253* (2013.01); *G06F 3/0446* (2019.05); *G06F 2203/04103* (2013.01); *G06F 2203/04105* (2013.01); *G06F 2203/04106* (2013.01)

(56) References Cited

FOREIGN PATENT DOCUMENTS

| CN | 206058153 U | 3/2017 |
| CN | 207764760 U | 8/2018 |

\* cited by examiner

2210

2210

(a)

(b)

FORCE TOUCH STRUCTURE, FORCE TOUCH PANEL AND DISPLAY DEVICE

TECHNICAL FIELD

At least one embodiment of the present disclosure relates to a force touch structure, a force touch panel and a display device.

BACKGROUND

With the continuous development of touch screen technology, multi-functional touch panels, especially touch panel products with touch sensing and force sensing, are becoming more and more popular. A force touch panel can be obtained by arranging a force sensing touch structure (namely force touch structure) on a touch panel (such as a display panel), and the obtained force touch panel has richer functions and more diversified interaction means.

SUMMARY

At least one embodiment of the present disclosure provides a force touch panel, which includes a display array layer and a force touch structure on a display side of the display array layer. The force touch structure includes a force sensing layer and a touch sensing layer, the force sensing layer and the touch sensing layer are laminated on the display array layer, the force sensing layer includes a plurality of force sensing electrodes, each of the plurality of force sensing electrodes is configured to change a resistance value upon being pressed, and the touch sensing layer is configured to detect a touch position.

For example, in the force touch panel provided by at least one embodiment of the present disclosure, each of the plurality of force sensing electrodes is configured to deform upon being pressed, so as to increase the resistance value.

For example, in the force touch panel provided by at least one embodiment of the present disclosure, at least one of the plurality of force sensing electrodes includes a first sensing sub-electrode and a second sensing sub-electrode electrically connected to each other.

For example, in the force touch panel provided by at least one embodiment of the present disclosure, the first sensing sub-electrode and the second sensing sub-electrode are on a same layer and abreast with each other.

For example, in the force touch panel provided by at least one embodiment of the present disclosure, the first sensing sub-electrode and the second sensing sub-electrode are arranged in a planar double spiral shape, and the first sensing sub-electrode and the second sensing sub-electrode are electrically connected at an intermediate position of the planar double spiral shape.

For example, in the force touch panel provided by at least one embodiment of the present disclosure, the force sensing layer further includes a first insulating layer, the first insulating layer is between the first sensing sub-electrode and the second sensing sub-electrode, a first via hole is arranged in the first insulating layer, and the first sensing sub-electrode and the second sensing sub-electrode are electrically connected through the first via hole.

For example, in the force touch panel provided by at least one embodiment of the present disclosure, at least one selected from the group consisting of the first sensing sub-electrode and the second sensing sub-electrode has a plane shape of single spiral.

For example, in the force touch panel provided by at least one embodiment of the present disclosure, the force sensing layer further includes a first signal line and a second signal line, the first signal line is electrically connected to one end of the first sensing sub-electrode that is not connected to the second sensing sub-electrode, and the second signal line is electrically connected to one end of the second sensing sub-electrode that is not connected to the first sensing sub-electrode.

For example, in the force touch panel provided by at least one embodiment of the present disclosure, a plane shape of at least one of the plurality of force sensing electrodes includes a wave shape, the force sensing layer further includes a first signal line and a second signal line, and the first signal line and the second signal line are respectively electrically connected to both ends of the at least one of the plurality of force sensing electrodes; or, the plane shape of at least one of the plurality of force sensing electrodes includes a single spiral shape, and the force sensing layer further includes a first signal line, a second signal line and a second insulating layer, the second insulating layer is between the at least one of the plurality of force sensing electrodes and the second signal line, the first signal line is electrically connected to an outer end of the at least one of the plurality of force sensing electrodes, a second via hole is arranged in the second insulating layer, and the second signal line is electrically connected to an inner end of the at least one of the plurality of force sensing electrodes through the second via hole.

For example, in the force touch panel provided by at least one embodiment of the present disclosure, the touch sensing layer includes a plurality of touch units, and the touch units are of a self-capacitive type or a mutual-capacitive type.

For example, in the force touch panel provided by at least one embodiment of the present disclosure, the display array layer includes a plurality of sub-pixel regions, and in a direction perpendicular to a plane on which the display array layer is located, at least one of the plurality of force sensing electrodes at least partially overlaps with the plurality of sub-pixel regions.

For example, in the force touch panel provided by at least one embodiment of the present disclosure, each of the plurality of sub-pixel regions includes a display region and a non-display region around the display region, and an orthographic projection of each of the plurality of force sensing electrodes on the display array layer is in the non-display region.

For example, in the force touch panel provided by at least one embodiment of the present disclosure, at least one of the plurality of force sensing electrodes is configured as a grid electrode.

For example, in the force touch panel provided by at least one embodiment of the present disclosure, the display array layer includes a plurality of light emitting elements and an encapsulation layer, the encapsulation layer is between the plurality of light emitting elements and the force touch structure, and the force touch structure is on a surface of the encapsulation layer away from the plurality of light emitting elements.

At least one embodiment of the present disclosure provides a display device, including the force touch panel according to any one of the above embodiments.

For example, the display device provided by at least one embodiment of the present disclosure further includes a controller, wherein the force sensing layer and the touch sensing layer are respectively connected to the controller in signal connection.

At least one embodiment of the present disclosure provides a force touch structure, which includes a force sensing layer and a touch sensing layer. The force sensing layer includes a plurality of force sensing electrodes, each of the plurality of force sensing electrodes is configured to change a resistance value upon being pressed, and the touch sensing layer is configured to detect a touch position.

For example, in the force touch structure provided by at least one embodiment of the present disclosure, each of the plurality of force sensing electrodes is configured to deform upon being pressed, so as to increase the resistance value.

For example, in the force touch structure provided by at least one embodiment of the present disclosure, at least one of the plurality of force sensing electrodes includes a first sensing sub-electrode and a second sensing sub-electrode electrically connected to each other, and the first sensing sub-electrode and the second sensing sub-electrode are on a same layer and abreast with each other.

For example, in the force touch structure provided by at least one embodiment of the present disclosure, the first sensing sub-electrode and the second sensing sub-electrode are arranged in a planar double spiral shape, and the first sensing sub-electrode and the second sensing sub-electrode are electrically connected at an intermediate position of the planar double spiral.

For example, in the force touch structure provided by at least one embodiment of the present disclosure, the force sensing layer includes a first sensing sub-electrode, a first insulating layer and a second sensing sub-electrode, the first insulating layer is between the first sensing sub-electrode and the second sensing sub-electrode, a first via hole is arranged in the first insulating layer, and the first sensing sub-electrode and the second sensing sub-electrode are electrically connected through the first via hole.

For example, in the force touch structure provided by at least one embodiment of the present disclosure, at least one selected from the group consisting of the first sensing sub-electrode and the second sensing sub-electrode has a plane shape of single spiral.

For example, in the force touch structure provided by at least one embodiment of the present disclosure, a plane shape of at least one of the force sensing electrode includes a wave shape or a single spiral shape.

For example, in the force touch structure provided by at least one embodiment of the present disclosure, the touch sensing layer includes a plurality of touch units, and the touch units are of a self-capacitive type or a mutual-capacitive type.

For example, in the force touch structure provided by at least one embodiment of the present disclosure, at least one of the plurality of force sensing electrodes is configured as a grid electrode.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Upper", "lower", "left", "right", etc. are only used to indicate the relative positional relationship, and when the absolute position of the object to be described is changed, the relative positional relationship may also change accordingly.

With the continuous development and progress of touch control display technology, in order to provide users with a multi-dimensional stereoscopic touch control experience, three-dimensional (3D) touch control display technology has gradually become the mainstream in the world. With the rise of flexible organic light emitting diode (OLED) technology, 3D touch control display technology has become the main direction of research and development for manufacturers of display products (such as mobile phones, tablet computers, notebook computers, etc.).

Figure 1:
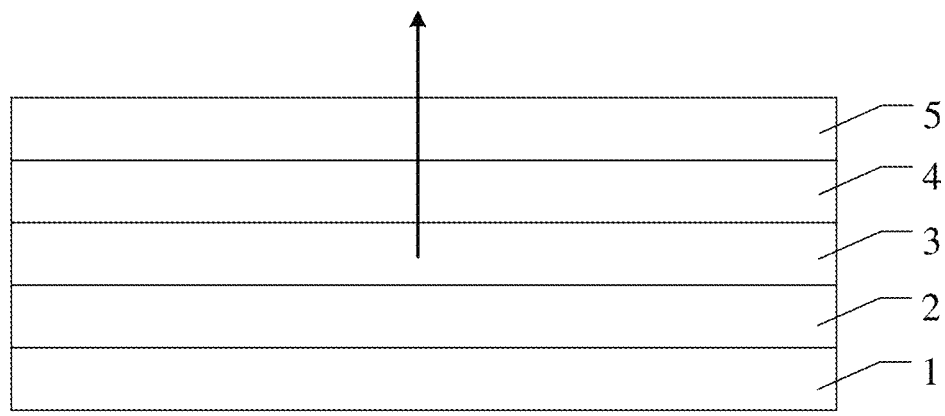
FIG. 1 is a cross-sectional view of a display device.

FIG. 1 is a cross-sectional view of a display device, illustrating a structural design of a touch display module for realizing the 3D touch display technology. As illustrated in FIG. 1, in order to realize the force touch control function, a force sensing structure 1 is attached onto a non-display side of a display panel 3 (e.g., a flexible display panel) using an adhesive layer 2 (e.g., an optically clear adhesive (OCA)), and a planar touch structure 5 is attached onto a display side of the display panel 3 using an adhesive layer 4 (e.g., an optically clear adhesive (OCA)). In FIG. 1, an arrow "↑" indicates the exiting direction of the display light of the display panel 3.

Although the display device illustrated in FIG. 1 can realize the functions of force sensing and touch control, it requires multiple times of attaching processes and assembly processes which are complicated, so that the yield of the entire display device may be adversely affected. In addition, besides the basic components for force sensing, the force sensing structure 1 also needs other auxiliary structures (e.g., a substrate with supporting function) to adapt to the attaching processes. These additional auxiliary structures will increase the cost and also lead to a larger thickness of the force sensing structure 1 itself. In addition, the thickness of the adhesive layer 2 and the thickness of the adhesive layer 4 are also relatively large. Therefore, the design thickness of the display device is large, which does not meet the demand of the terminal market for light and thin products. Moreover, a touch control operation requires force to be applied to the force sensing structure 1 through the planar touch structure 5 and the display panel 3, which also makes the sensitivity of force touch control low.

At least one embodiment of the present disclosure provides a force touch panel, which includes a display array layer and a force touch structure on a display side of the display array layer. The force touch structure includes a force sensing layer and a touch sensing layer which are laminated, the force sensing layer includes a plurality of force sensing electrodes, each of the plurality of force sensing electrodes is configured to change a resistance value upon being pressed, and the touch sensing layer is configured to detect a touch position. In the force touch panel of the present embodiment, the force touch structure including the force sensing layer and the touch sensing layer can realize the three-dimensional touch control function, and the force sensing layer is located on the display side of the force touch panel. For example, when performing a touch control operation, the force sensing layer is close to the finger, and the sensitivity of force sensing is high.

Hereinafter, a force touch structure, a force touch panel, and a display device according to at least one embodiment of the present disclosure will be described with reference to the accompanying drawings.

Figure 2:
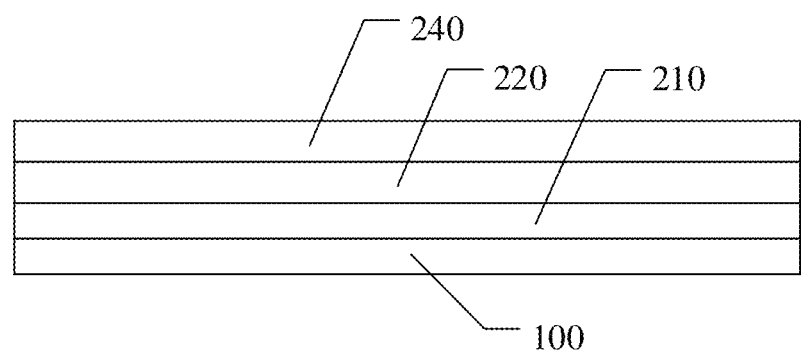
FIG. 2 is a cross-sectional view of a force touch panel according to some embodiments of the present disclosure.

FIG. 2 is a cross-sectional view of a force touch panel according to some embodiments of the present disclosure.

At least one embodiment of the present disclosure provides a force touch panel. As illustrated in FIG. 2, the force touch panel includes a substrate 100, and a display array layer 210 and a force touch structure which are on the substrate 100. The force touch structure includes a force sensing layer 220 and a touch sensing layer 240 laminated on the display array layer 210, and the force touch structure is on a display side of the display array layer 210. For example, a side of the display array layer 210 away from the substrate 100 is the display side (upper side in FIG. 2). Thus, in the process of a touch control operation (such as finger touch), a distance between the force sensing layer 220 and the finger is less than a distance between the display array layer 210 and the finger, so that the force sensing layer 220 can have a relatively high sensitivity during the touch control operation. The structure of the touch sensing layer 240 can be referred to the related description of the following embodiments (for example, the embodiments illustrated in FIGS. 4A and 4B), and will not be described in detail herein.

For example, in the force touch panel provided by at least one embodiment of the present disclosure, each of the plurality of force sensing electrodes included in the force sensing layer is configured to deform upon being pressed, so as to increase the resistance value, so that force sensing can be realized by detecting the change of the resistance value. For example, a deformation corresponds to the stretching of the force sensing electrode under force (i.e. pressure). After being stretched, the resistance value of the force sensing electrode changes (for example, the resistance value increases). For example, during the touch control operation, at the touch position, the force sensing electrode is stretched due to the pressure generated by touch. The greater the force applied during touch, the greater the degree to which the force sensing electrode is stretched, and the greater the degree to which the resistance value of the force sensing electrode changes (for example, the greater the resistance value). Thus, the magnitude of the force can be detected by detecting the resistance value of the force sensing electrode.

In at least one embodiment of the present disclosure, the structure of the force sensing layer (i.e., the force sensing electrode) can be designed as needed, as long as the force sensing layer can deform to change the resistance value when subjected to force. Hereinafter, in at least one embodiment, several kinds of structures of the force sensing layer of the force touch panel will be described.

Figure 3A:
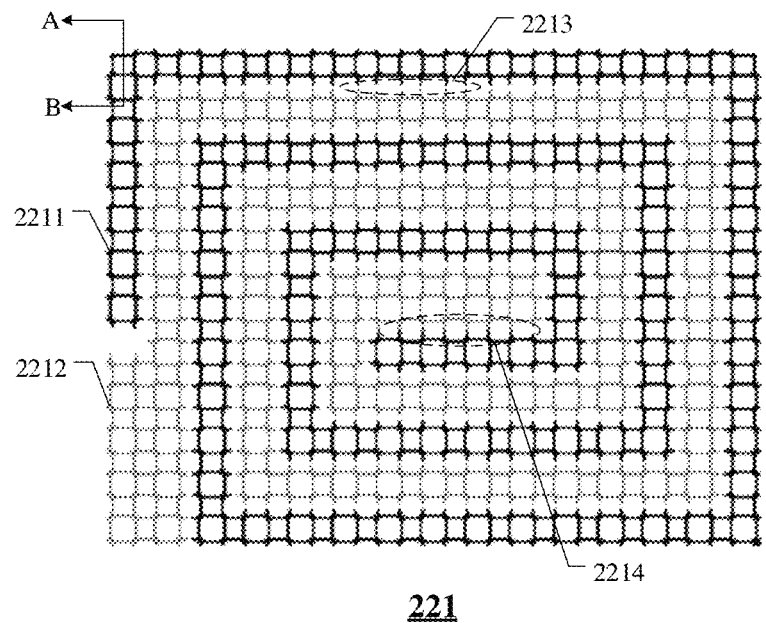
FIG. 3A is a plan view of a force sensing electrode of a force touch panel according to some embodiments of the present disclosure.
Figure 3B:
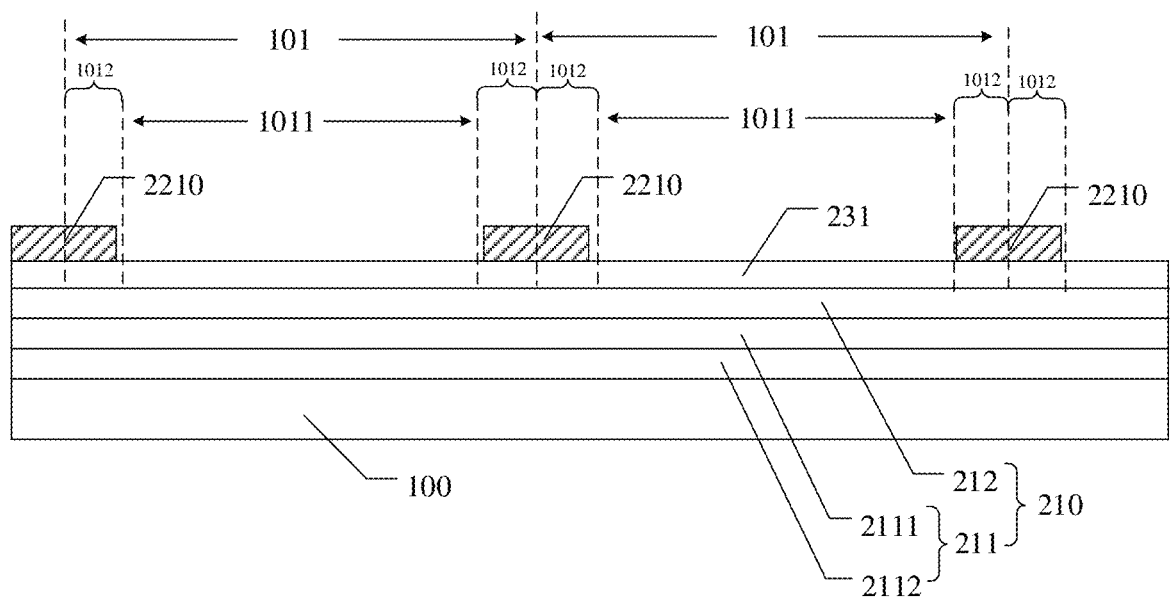
FIG. 3B is a cross-sectional view of the force touch panel illustrated in FIG. 3A taken along line A-B.
Figure 3C:
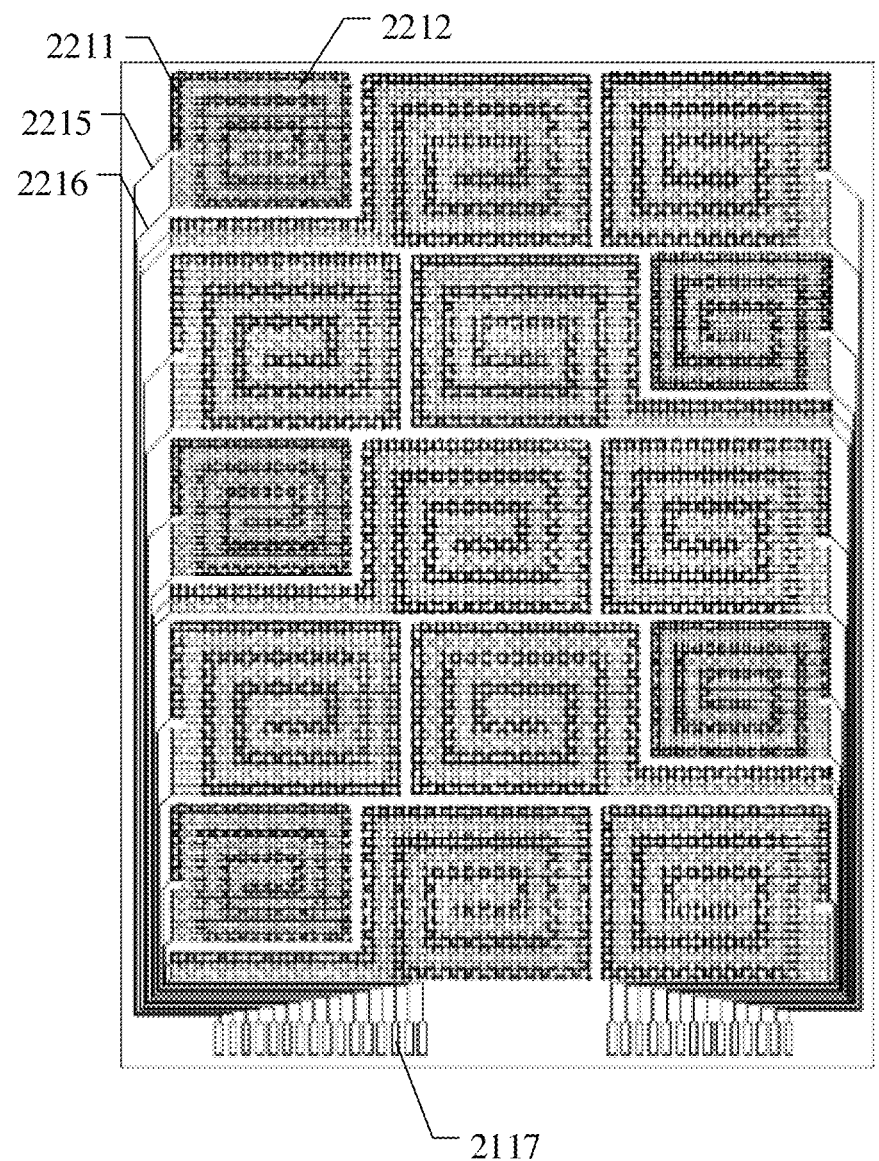
FIG. 3C is a plan view of the force touch panel illustrated in FIG. 3A.

FIG. 3A is a plan view of a force sensing electrode of a force touch panel provided by some embodiments of the disclosure, FIG. 3B is a cross-sectional view of the force touch panel illustrated in FIG. 3A taken along line A-B, and FIG. 3C is a plan view of the force touch panel illustrated in FIG. 3A.

For example, in the force touch panel provided by at least one embodiment of the present disclosure, at least one force sensing electrode includes a first sensing sub-electrode and a second sensing sub-electrode electrically connected to each other. For example, in the force touch panel provided by at least one embodiment of the present disclosure, the first sensing sub-electrode and the second sensing sub-electrode are located on a same layer and are arranged abreast with each other (there is no overlapping part with each other), and the first sensing sub-electrode and the second sensing sub-electrode are arranged in a planar double spiral shape.

For example, as illustrated in FIGS. 3A, 3B, and 3C, the force sensing electrode 221 includes a first sensing sub-electrode 2211 and a second sensing sub-electrode 2212 arranged in a planar double spiral shape. For example, the first sensing sub-electrode 2211 and the second sensing sub-electrode 2212 are electrically connected to each other in a connection region 2214, the connection region 2214 is located at an intermediate position (e.g., center) of the planar double spiral shape, and the first sensing sub-electrode 2211 and the second sensing sub-electrode 2212 are separated from each other in other regions (disconnection region 2213) other than the connection region 2214, thereby being insulated from each other in these regions.

For example, in the force touch panel provided by at least one embodiment of the present disclosure, the force sensing layer further includes a first signal line and a second signal line, the first signal line is electrically connected to one end of the first sensing sub-electrode that is not connected to the second sensing sub-electrode, and the second signal line is electrically connected to one end of the second sensing sub-electrode that is not connected to the first sensing sub-electrode.

For example, as illustrated in FIG. 3C, the plurality of force sensing electrodes are arranged side by side on the force touch panel. For each force sensing electrode, the first signal line 2215 is electrically connected to the first sensing sub-electrode 2211, and the second signal line 2216 is electrically connected to the second sensing sub-electrode 2212. In this way, a detection signal can be applied to and received from the force sensing electrode 221 through the first signal line 2215 and the second signal line 2216, thereby detecting the resistance value of the force sensing electrode 221. For example, in a case where the first sensing sub-electrode and the second sensing sub-electrode are arranged in a planar double spiral shape as illustrated in FIGS. 3A, 3B, and 3C, the first signal line 2215 and the first sensing sub-electrode 2211 are formed on a same layer and with a same material, and the second signal line 2216 and the second sensing sub-electrode 2212 are formed on a same layer and with a same material. For example, in the manufacturing process of the force touch panel, a same material layer can be patterned to form the first signal line, the first sensing sub-electrode, the second signal line and the second sensing sub-electrode.

For example, one end of the first signal line away from the first sensing sub-electrode is provided as a contact pad for being electrically connected to a detection circuit or being directly electrically connected to the detection circuit, one end of the second signal line is electrically connected to the second sensing sub-electrode, and the other end of the second signal line away from the second sensing sub-electrode is provided as a contact pad for being electrically connected to the detection circuit or being directly electrically connected to the detection circuit.

For example, as illustrated in FIG. 3C, the ends of the first signal line 2215 and the second signal line 2216 away from the force sensing electrode 221 are provided as contact pads 2117, so as to facilitate connection with the external detection circuit (e.g., a flexible circuit board provided with a controller). For example, the contact pads 2117 can be integrally formed with the first signal line 2215 and the second signal line 2216, or can be formed separately. For example, the contact pads 2117 are located in a bonding region of the force touch panel.

For a force sensing electrode, the formula for calculating the resistance is $R=\rho \times L/S$, where R is the resistance value, $\rho$ is the resistivity, L is the length of the resistance, and S is the cross-sectional area of the resistance. In a case where the force sensing electrode is stretched, the length L increases, and S decreases, that is, the resistance value of the force sensing electrode increases.

Figure 3D:
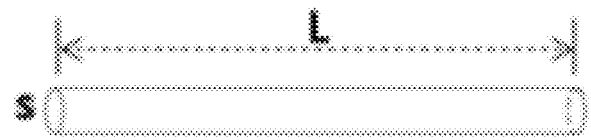
FIG. 3D is a schematic structural diagram of a force sensing electrode in the force touch panel illustrated in FIG. 3B when not being pressed.
Figure 3E:
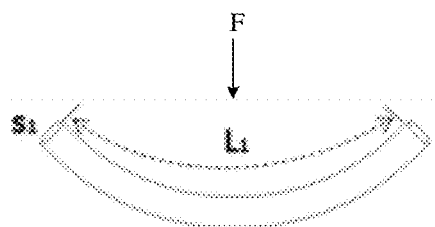
FIG. 3E is a schematic structural diagram of the force sensing electrode illustrated in FIG. 3D when being pressed.

FIG. 3D is a schematic structural diagram of a force sensing electrode in the force touch panel illustrated in FIG. 3B when not being pressed, and FIG. 3E is a schematic structural diagram of the force sensing electrode illustrated in FIG. 3D when being pressed.

For example, the force sensing electrode can be formed of an electrode strip 2210. As illustrated in FIG. 3D, when the electrode strip 2210 is not pressed, the length is L and the cross-sectional area is S. As illustrated in FIG. 3E, under the action of the force (pressure) F, the electrode strip 2210 is deformed, the length of the electrode strip 2210 is L1, and the cross-sectional area is S1. In the above process, the volume of the electrode strip 2210 is unchanged and the electrode strip 2210 is stretched due to the pressure, so L1>L, S1<S. According to the formula for calculating the resistance, in the process illustrated from FIG. 3D to FIG. 3E, the resistance value of the electrode strip 2210 increases, and the greater the pressure F, the greater the change amount of the resistance value. In this way, the magnitude of the touch pressure can be determined by detecting the resistance value of the force sensing electrode. In this way, if the deformation of the force sensing electrode is larger under the same pressure condition, the larger the change amount of the resistance value of the force sensing electrode is, and the higher the sensitivity of the force sensing layer is.

For example, in the force touch panel provided by at least one embodiment of the present disclosure, a plane shape of at least one of the plurality of force sensing electrodes is a wave shape. The force sensing layer further includes a first signal line and a second signal line, and the first signal line and the second signal line are respectively electrically connected to both ends of the at least one of the plurality of force sensing electrodes. For example, the wave shape can be a shape of an S-shaped electrode or a shape of a plurality of S-shaped electrodes connected end to end. For example, as illustrated in FIG. 3F, the force sensing electrode 221*a* is a wavy electrode formed by connecting a plurality of S-shaped electrodes end to end.

For example, in the force touch panel provided by at least one embodiment of the present disclosure, in a case where the plane shape of at least one of the plurality of force sensing electrodes is a wave shape, the force sensing layer further includes a first signal line and a second signal line, the first signal line and the second are respectively electrically connected to both ends of the at least one of the plurality of force sensing electrodes.

Figure 3F:
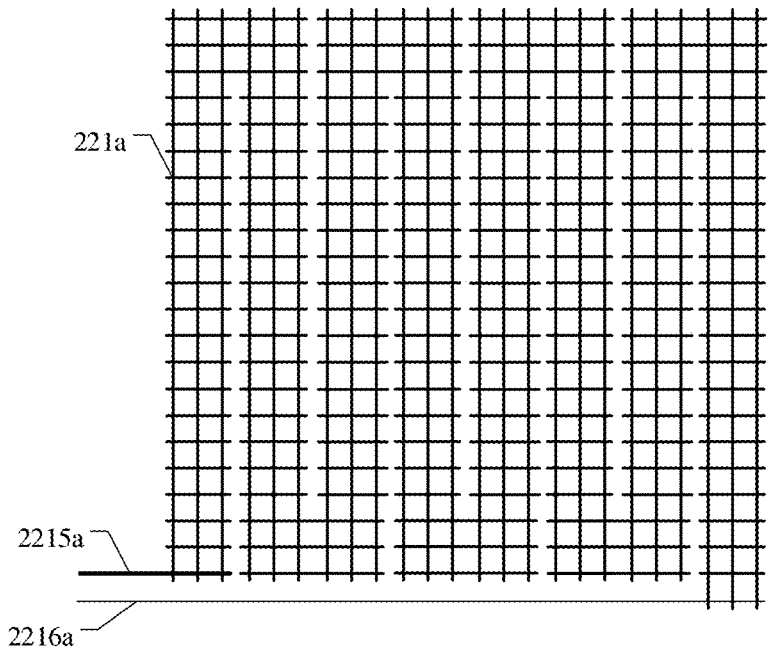
FIG. 3F is a schematic structural diagram of another force touch panel according to some embodiments of the present disclosure.

For example, as illustrated in FIG. 3F, the first signal line 2215*a* and the second signal line 2216*a* are electrically connected to both ends of the force sensing electrode 221*a*. In this way, a detection signal can be applied to and received from the force sensing electrode 221*a* through the first signal line 2215*a* and the second signal line 2216*a*, thereby detecting the resistance value of the force sensing electrode 221*a*. For example, the first signal line 2215*a* and the second signal line 2216*a* are formed on a same layer and with a same material as the force sensing electrode 221*a*. For example, in the manufacturing process of the force touch panel, a same material layer can be patterned to form the first signal line, the second signal line and the force sensing electrode.

Figure 3G:
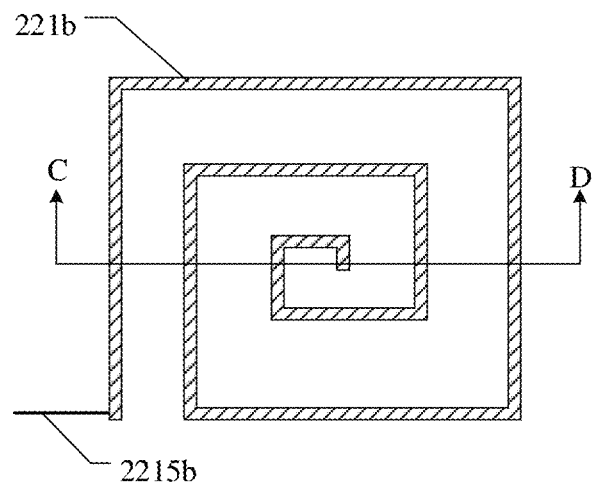
FIG. 3G is a schematic structural diagram of further another force touch panel according to some embodiments of the present disclosure.
Figure 3G:
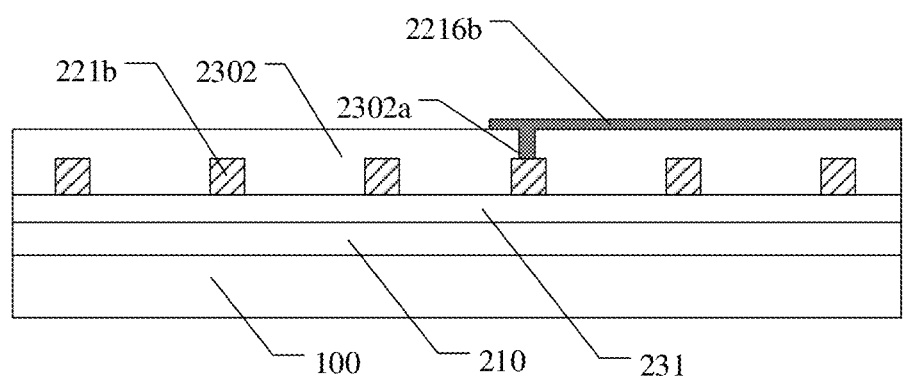

FIG. 3G is a schematic structural diagram of further another force touch panel according to some embodiments of the present disclosure. FIG. (a) in FIG. 3G is a plan view of a force touch electrode of the force touch panel, FIG. (b) in FIG. 3G is a cross-sectional view of the force touch panel, and the cross-section corresponds to the cross line C-D in FIG. (a).

For example, in the force touch panel provided by at least one embodiment of the present disclosure, a plane shape of at least one of the plurality of force sensing electrodes is a single spiral shape. For example, the force sensing layer further includes a first signal line, a second signal line and a second insulating layer, the second insulating layer is between the at least one of the plurality of force sensing electrodes and the second signal line, the first signal line is electrically connected to an outer end of the at least one of the plurality of force sensing electrodes, a second via hole is arranged in the second insulating layer, and the second signal line is electrically connected to an inner end of the at least one of the plurality of force sensing electrodes through the second via hole.

For example, as illustrated in FIG. 3G, the force sensing electrode 221b is a long strip and coiled into a single spiral shape, the first signal line 2215b is electrically connected to the outer end of the single spiral-shaped force sensing electrode 221b, the second insulating layer 2302 is disposed between the second signal line 2216b and the force sensing electrode 221b, a second via hole 2302a exposing the inner end of the single spiral-shaped force sensing electrode 221b is disposed in the second insulating layer 2302, and the second signal line 2216b is electrically connected to the inner end of the force sensing electrode 221b through the second via hole 2302a.

For example, as illustrated in FIG. 3G, the first signal line 2215b and the force sensing electrode 221b are formed on a same layer and with a same material. For example, in the manufacturing process of the force touch panel, a same material layer can be patterned to form the first signal line 2215b and the force sensing electrode 221b, then an insulating material film can be deposited on the force sensing electrode 221b to form the second insulating layer 2302, the second insulating layer 2302 can be patterned to form the second via hole 2302a exposing the inner end of the single spiral-shaped force sensing electrode 221b, after that, a conductive material is deposited on the second insulating layer 2302 and then is patterned to form the second signal line 2216b, and the second signal line 2216b is electrically connected to the inner end of the force sensing electrode 221b through the second via hole 2302a.

Figure 3H:
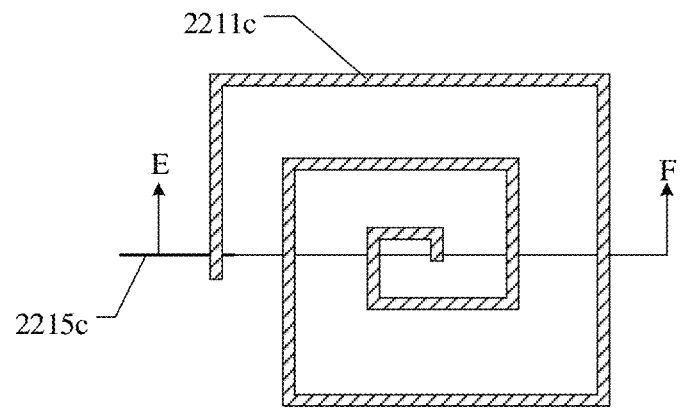
FIG. 3H is a schematic structural diagram of still another force touch panel according to some embodiments of the present disclosure.
Figure 3H:
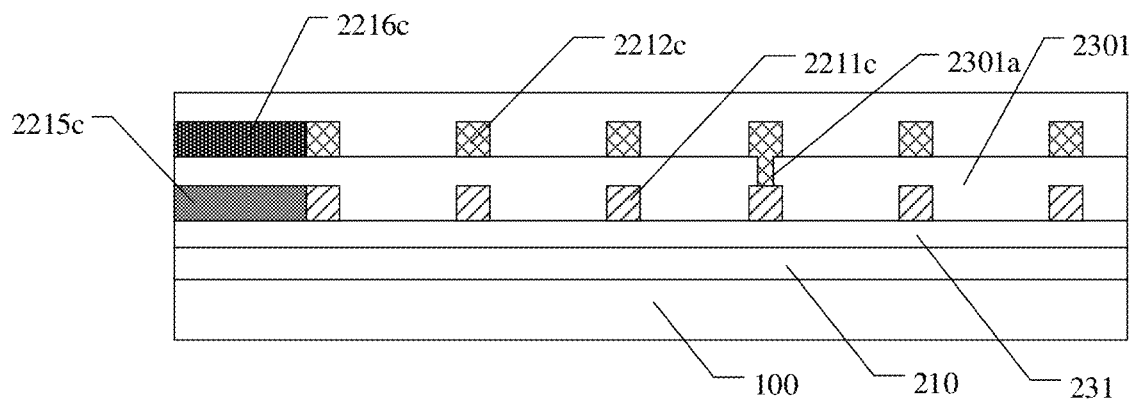

FIG. 3H is a schematic structural diagram of still another force touch panel according to some embodiments of the present disclosure. FIG. (a) in FIG. 3H is a plan view of a part of a force touch electrode of the force touch panel, FIG. (b) in FIG. 3H is a cross-sectional view of the force touch panel, and the cross-section corresponds to the cross line E-F in FIG. (a).

For example, in the force touch panel provided by at least one embodiment of the present disclosure, at least one force sensing electrode includes a first sensing sub-electrode and a second sensing sub-electrode electrically connected to each other. For example, in the force touch panel provided by at least one embodiment of the present disclosure, the force sensing layer further includes a first insulating layer. The first sensing sub-electrode, the first insulating layer and the second sensing sub-electrode are laminated in sequence, and the first insulating layer is between the first sensing sub-electrode and the second sensing sub-electrode. A first via hole is arranged in the first insulating layer, and the first sensing sub-electrode and the second sensing sub-electrode are electrically connected through the first via hole.

For example, as illustrated in FIG. 3H, the force sensing electrode includes a first sensing sub-electrode 2211c and a second sensing sub-electrode 2212c, the first sensing sub-electrode 2211c and the second sensing sub-electrode 2212c are located at different layers and laminated on the display array layer 210, a first insulating layer 2301 is disposed between the first sensing sub-electrode 2211c and the second sensing sub-electrode 2212c, a first via hole 2301a is disposed in the first insulating layer 2301, and the first sensing sub-electrode 2211c and the second sensing sub-electrode 2212c are electrically connected through the first via hole 2301a. Thus, the first sensing sub-electrode 2211c and the second sensing sub-electrode 2212c are located at different layers. In this way, in a direction parallel to a plane on which the substrate 100 is located, the force sensing electrode has a larger resistance value without increasing its own design size, and when deformation occurs due to pressure, the change amount of the resistance value of the force sensing electrode is also larger, thereby improving the sensitivity of force sensing.

For example, in the force touch panel provided by at least one embodiment of the present disclosure, in a case where the force sensing electrode includes a first sensing sub-electrode and a second sensing sub-electrode electrically connected to each other and located at different layers, the plane shape of at least one selected from the group consisting of the first sensing sub-electrode and the second sensing sub-electrode is a single spiral shape. For example, in the force touch panel provided by at least one embodiment of the present disclosure, the force sensing layer further includes a first signal line and a second signal line, the first signal line is electrically connected to one end of the first sensing sub-electrode that is not connected to the second sensing sub-electrode, and the second signal line is electrically connected to one end of the second sensing sub-electrode that is not connected to the first sensing sub-electrode.

For example, as illustrated in FIG. 3H, the first sensing sub-electrode 2211c of the force sensing electrode is a long strip and coiled into a single spiral shape. For example, the second sensing sub-electrode 2212c of the force sensing electrode is also a long strip and coiled into a single spiral shape, and the shape of the second sensing sub-electrode 2212c can be the same as or similar to that of the first sensing sub-electrode 2211c. As illustrated in FIG. 3H, an inner end of the single spiral-shaped first sensing sub-electrode 2211c is electrically connected to an inner end of the second sensing sub-electrode 2212c through the first via hole 2301a in the first insulating layer 2301, the first signal line 2215c is electrically connected to an outer end of the single spiral-shaped first sensing sub-electrode 2211c, and the second signal line 2216c is electrically connected to an outer end of the single spiral-shaped second sensing sub-electrode 2212c.

For example, as illustrated in FIG. 3H, the first signal line 2215c and the first sensing sub-electrode 2211c are formed on a same layer and with a same material, and the second signal line 2216c and the second sensing sub-electrode 2212c are formed on a same layer and with a same material. For example, in the manufacturing process of the force touch panel, a same material layer can be patterned to form the first signal line 2215c and the first sensing sub-electrode 2211c, then an insulating material film can be deposited on the first sensing sub-electrode 2211c to form the first insulating layer 2301, the first insulating layer 2301 can be patterned to form the first via hole 2301a exposing the inner end of the single spiral-shaped first sensing sub-electrode 2211c, after that, a conductive material is deposited on the first insulating layer 2301 and then is patterned to form the second signal line 2216c and the second sensing sub-electrode 2212c.

For example, in at least one embodiment of the present disclosure, the force sensing layer can include a plurality (e.g., at least three) of sensing sub-electrodes located at different layers, the plurality of sensing sub-electrodes are laminated with each other and connected in sequence, and the connection mode between the plurality of sensing sub-electrodes can be referred to that between the first sensing sub-electrode 2211c and the second sensing sub-electrode 2212c in FIG. 3H. In this way, in the direction parallel to the plane on which the substrate is located, the force sensing electrode has a larger resistance value without increasing its own design size, and the sensitivity of force sensing is high.

For example, in the force touch structure provided by at least one embodiment of the present disclosure, the display array layer includes a plurality of sub-pixel regions, and in a direction perpendicular to a plane on which the display array layer is located, at least one of the plurality of force sensing electrodes at least partially overlaps with the plurality of sub-pixel regions. In this way, one force sensing electrode corresponds to a plurality of sub-pixel regions, and during a touch control operation, one force sensing electrode can detect the pressure on a plurality of sub-pixel regions.

For example, in at least one embodiment of the present disclosure, the force sensing electrode is a transparent electrode, so that light emitted from the display array layer can pass through the force sensing electrode to display an image.

For example, in at least one embodiment of the present disclosure, each of the plurality of sub-pixel regions includes a display region and a non-display region around the display region, and an orthographic projection of each of the plurality of force sensing electrodes on the display array layer is in the non-display region. In this way, the material of the sensing electrode is not limited, and can be a transparent conductive material or an opaque conductive material, moreover, the brightness of light emitted from the display array layer does not decay when passing through the force sensing electrode, and the effect of displaying images by the force touch panel is good.

For example, in at least one embodiment of the present disclosure, at least one of the force sensing electrodes is configured as a grid electrode. For example, the grid electrode includes a plurality of electrode strips crossing each other to form grids.

For example, as illustrated in FIGS. 3A to 3C, at least one of the force sensing electrodes 221 (e.g., the first sensing sub-electrode and the second sensing sub-electrode) is a grid electrode and is formed of a plurality of electrode strips 2210 that cross each other to form a plurality of meshes. The sub-pixel region 101 includes a display region 1011 and a non-display region 1012 located around the display region 1011, and an orthographic projection of the electrode strip 2210 on the display array layer 210 is located in the non-display region 1012. The orthographic projection of the electrode strip 2210 of the grid electrode (force sensing electrode 221) on the substrate 100 is located in the non-display region 1012, and an opening defined by the electrode strips 2210 correspond to the display region 1011. In this way, during the display process of the force touch panel, the light for display will not be blocked by the grid electrode, that is, the arrangement of the force sensing electrode 221 will not affect the brightness of the display image of the force touch panel.

In a case where the thickness and material of the electrode are determined, compared with a planar electrode, the total area of the cross-section of the grid electrode is smaller and the resistance value thereof is larger, when deforming due to pressure, the change amount of the resistance value is more obvious, and the sensitivity of force detection is higher; In addition, the stress generated in the grid electrode when being pressed is small, and the stress is easily released to reduce the risk of stress concentration, and the grid electrode is not easy to fracture, thus reducing the risk of fracture of the grid electrode during touch control detection. For example, even if a local part of the grid electrode is broken due to excessive stress, a crack generated at the corresponding position will be stopped when extending to a mesh, and the stress will be released at the same time, so that the crack will not continue to extend in the grid electrode and cause the whole grid electrode to break, and thus, the grid electrode still has good conductivity. At the same time, the grid electrode also has higher light transmittance than the planar electrode, which is helpful to improve the display effect.

For example, in some other embodiments of the present disclosure, the force sensing electrode is configured as a strip electrode. The strip shape can be linear, curved, spiral, etc.

For example, as illustrated in FIGS. 3G and 3H, the plane shape of the force sensing electrode (the first sensing sub-electrode and the second sensing sub-electrode) is a spiral shape, and the orthographic projection of the force sensing electrode on the substrate is in the non-display region.

For example, in at least one embodiment of the present disclosure, the force sensing electrode can be a single-layer structure (i.e., the wiring of the force sensing electrode is a single-layer structure), or can be a multi-layer composite structure formed of a plurality of film layers. For example, the force sensing electrode is a lamination formed of a plurality of metal layers, such as a three-layer metal lamination formed of titanium-aluminum-titanium or molybdenum-aluminum-molybdenum. The multi-layer composite structure can improve the fracture resistance of the force sensing electrode under pressure, and can reduce the reflection of light, thereby improving the display effect of the force touch panel. For example, in a case where the force sensing electrode is a multi-layer composite structure formed of a plurality of film layers, in the manufacturing process of the force sensing electrode, a lamination of a plurality of film layers can be deposited at one time, and then the lamination is subjected to a patterning process (e.g., photolithography process) to form the force sensing electrode.

For example, in the force touch panel provided by at least one embodiment of the present disclosure, the force touch structure includes a touch sensing layer for positioning a touch. The touch sensing layer can be configured to detect the position of the touch on a surface (plane) of the display side, and the force sensing layer can be configured to detect the force magnitude of the touch (the force magnitude along a direction perpendicular to the surface of the display side), so that the force touch panel can have a three-dimensional touch control function.

For example, in some embodiments of the present disclosure, the force sensing layer is between the touch sensing layer and the display array layer. For example, in some other embodiments of the present disclosure, the touch sensing layer is between the force sensing layer and the display array layer.

Hereinafter, taking that the force sensing layer is located between the touch sensing layer and the display array layer as an example, the technical solutions in at least one of the following embodiments of the present disclosure will be described.

For example, in the force touch panel provided by at least one embodiment of the present disclosure, the touch sensing layer includes a plurality of touch units, and the types of the touch units can be of a resistive type, a capacitive type, an infrared type, an acoustic type or other types. For example, a capacitive type touch unit can be of a self-capacitive type, or a mutual-capacitive type, etc. For example, for a capacitive type touch unit, in a case where an external object (such as a finger) approaches, the capacitance value of the capacitive type touch unit changes, so that the touched position of the force touch panel can be detected. The embodiments of the present disclosure do not limit the type and specific structure of the touch sensing layer.

For example, in the force touch panel provided by at least one embodiment of the present disclosure, the touch units are of a mutual-capacitive type, and each touch unit includes a first electrode and a second electrode, the first electrode and the second electrode are crossed with each other and insulated from each other, and they provide a detection capacitance at a crossing position. For example, the first electrode and the second electrode are arranged on a same layer. In the process of manufacturing the force touch panel, a same conductive layer is patterned to obtain a segmented first electrode and a continuous second electrode, and then a connection electrode electrically connecting the segmented first electrode together are prepared in another layer, which is beneficial to simplifying the manufacturing process and reducing the thickness. Alternatively, the first electrode and the second electrode are located in different layers, and different conductive layers are patterned to obtain a continuous first electrode and a continuous second electrode, respectively, an insulating layer is formed between the different conductive layers, and in the process of manufacturing the force touch panel, the first electrodes and the second electrodes can be crossed with each other and insulated from each other without other auxiliary structures (such as the connection electrode for bridging) and the manufacturing process is simplified.

Figure 4A:
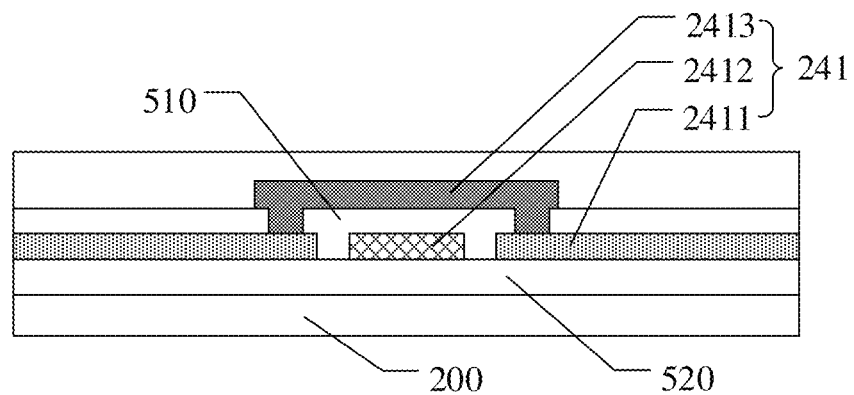
FIG. 4A is a cross-sectional view of a touch unit of a force touch panel according to some embodiments of the present disclosure.
Figure 4B:
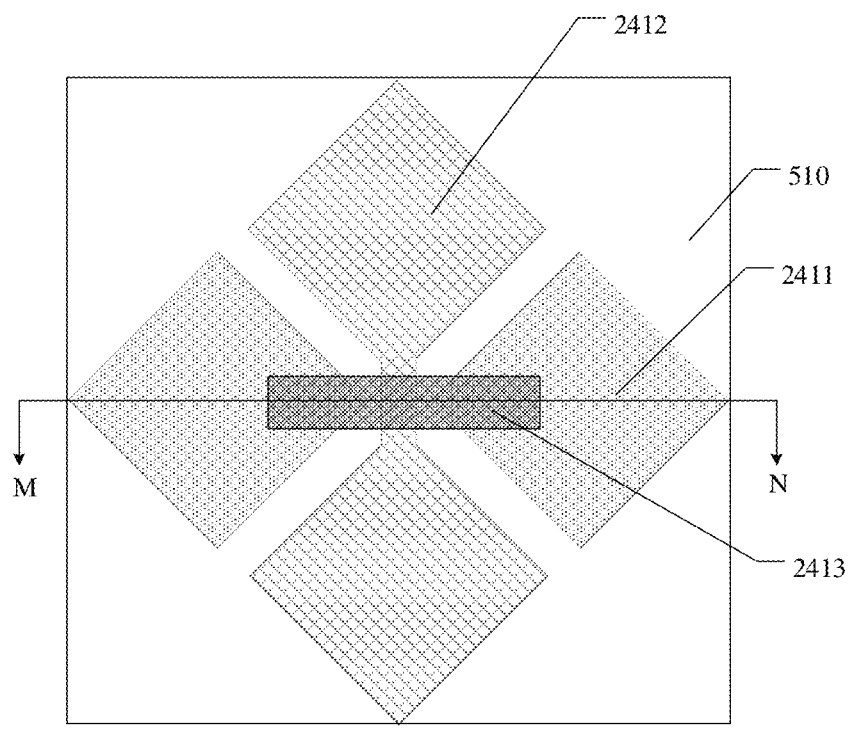
FIG. 4B is a plan view of the touch unit illustrated in FIG. 4A.

FIG. 4A is a cross-sectional view of a touch unit of a force touch panel according to some embodiments of the present disclosure, FIG. 4B is a plan view of the touch unit illustrated in FIG. 4A, and FIG. 4A is a cross-sectional view of the touch unit illustrated in FIG. 4B taken along line M-N.

For example, in the force touch panel provided by at least one embodiment of the present disclosure, as illustrated in FIGS. 4A and 4B, each touch unit 241 includes a first electrode 2411 and a second electrode 2412 that are crossed with each other and insulated from each other. For example, the touch unit 241 further includes a connection electrode 2413, the first electrode 2411 and the second electrode 2412 are on a same layer, the first electrode 2411 is segmented at an intersection with the second electrode 2412, thus forming a segmented structure; the connection electrode 2413 is separated from the second electrode 2412, and the segmented portions of the first electrode 2411 are electrically connected together by the connection electrode 2413, so as to form a detection capacitance via the connection electrode 2413 located at the intersection. For example, in the process of manufacturing the force touch panel, after the first electrode 2411 and the second electrode 2412 on the same layer are formed, an insulating layer 510 is covered thereon, via holes are formed in the insulating layer 510, and then a connection electrode 2413 is formed on the insulating layer 510. The portions of the first electrode 2411 located on both sides of the second electrode 2412 are electrically connected to the connection electrode 2413 through the via holes in the insulating layer. For example, the first electrode 2411 and the second electrode 2412 are electrically connected to a position detection circuit through corresponding wires formed on the force touch panel, respectively.

For example, in at least one embodiment of the present disclosure, as illustrated in FIG. 4A, a second buffer layer 520 can be disposed between the force sensing layer 200 and the touch sensing layer (touch unit 241). The second buffer layer 520 can serve as an insulating layer between the force sensing electrode of the force sensing layer and the electrode structure of the touch sensing layer (e.g., the first electrode and the second electrode). For example, the second buffer layer 520 is configured to have a planarization effect, thereby improving the yield of the electrode structure of the touch sensing layer.

For example, in some other embodiments of the present disclosure, as illustrated in FIG. 2, the touch sensing layer 240 can be a two-dimensional touch structure, and the two-dimensional touch structure 240 can be formed on (and insulated from) the force sensing layer 220 by deposition (e.g., magnetron sputtering, etc.), so that there is no need to arrange the two-dimensional touch structure 240 on the force touch panel in an attaching manner with an adhesive layer, and there is no need to provide the two-dimensional touch structure 240 with auxiliary structures (e.g., a substrate for supporting) or the like to adapt to the attaching process, and the design thickness of the force touch structure is small, which is beneficial to the light and thin design of the force touch panel. For example, in some other embodiments of the present disclosure, the force sensing layer can be formed on the touch sensing layer by deposition (e.g., magnetron sputtering, etc.).

For example, in the force touch panel provided by at least one embodiment of the present disclosure, a force touch structure (e.g., a force sensing layer) is formed on the display array layer by deposition (e.g., magnetron sputtering, evaporation, chemical vapor deposition, etc.) and etching, etc., so that the force touch structure is in direct contact with the surface at the display side of the display array layer, that is, the surface at the display side of the display array layer is used as a substrate for forming the force touch structure thereon. For example, forming a force sensing layer on the surface of the display array layer does not require providing an adhesive layer to arrange the force sensing layer on the force touch panel in an attaching manner, and the force sensing layer does not need to be provided with an auxiliary structure (e.g. a substrate for supporting) or the like to adapt to the attaching process, and the design thickness of the force sensing layer is small, thereby facilitating the light and thin design of the force touch panel.

For example, in the techniques adopted by the display device illustrated in FIG. 1, the thickness of the force sensing structure and the adhesive layer used for attaching the force sensing structure is at least several hundred micrometers or even can up to millimeter level. In some embodiments of the present disclosure, in a case where the force sensing layer is formed on the display array layer by means of deposition, the thickness of the force sensing layer (force sensing electrode) can be several hundred nanometers or several micrometers, and the thickness of the related insulating layer can be several tens of nanometers or several hundred nanometers. Therefore, the thickness of the force sensing layer and related structures (e.g., insulating layer) of the force touch panel obtained by some embodiments of the present disclosure is much less than the total thickness of the force sensing structure and the adhesive layers of the force touch panel obtained using the techniques adopted by the display device illustrated in FIG. 1. Compared with the force touch panel adopted by the display device illustrated in FIG. 1, the thickness of the force touch panel provided by some embodiments of the present disclosure can be reduced by at least 0.3 mm.

Figure 5:
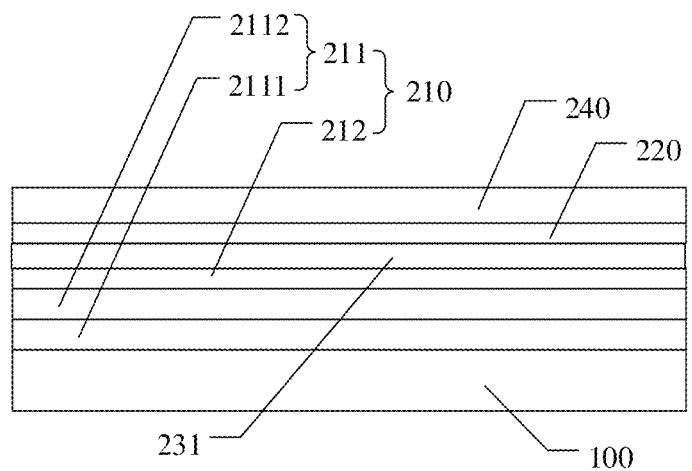
FIG. 5 is a cross-sectional view of another force touch panel according to some embodiments of the present disclosure.

For example, in the force touch panel provided by at least one embodiment of the present disclosure, the display array layer can include an encapsulation layer and a light emitting drive circuit layer, the encapsulation layer covers the light emitting drive circuit layer to improve the protection function, and the force sensing layer is located on a surface of the encapsulation layer away from the light emitting drive circuit layer. For example, as illustrated in FIG. 5, the encapsulation layer 212 covers the light emitting drive circuit layer 211, and the force sensing layer 220 is located on a surface of the encapsulation layer 212 away from the substrate 100. The encapsulation layer 212 can protect the light emitting drive circuit layer 211, so as to prevent external water, oxygen and the like from invading the interior of the force touch panel and damaging the light emitting drive circuit layer 211. In the manufacturing process of the force touch panel, after the encapsulation layer 212 is formed, the force sensing layer 220 is manufactured (deposited) on the surface of the encapsulation layer 212. For example, the encapsulation layer 212 can planarize the surface of the force touch panel, thereby improving the yield of the force sensing layer 220.

For example, in the force touch panel provided by at least one embodiment of the present disclosure, the force touch panel includes a plurality of sub-pixel regions, and the light emitting drive circuit layer includes a plurality of pixel driving circuits and a plurality of light emitting elements located in the plurality of sub-pixel regions, respectively. For example, as illustrated in FIGS. 3A, 3B, 3C and 5, the light emitting drive circuit layer 211 includes a plurality of pixel driving circuits 2111 and a plurality of light emitting elements 2112. Each sub-pixel region 101 is provided with one light emitting element 2112 and one pixel driving circuit 2111 for driving the light emitting element 2112 to emit light. For example, the light emitting element are located in the display region 1011 of the sub-pixel region 101.

For example, the light emitting element can be an organic light emitting diode (OLED) or a quantum dot light emitting diode (QLED), etc., for example, the OLED or QLED includes a lamination of an anode, a light emitting function layer, and a cathode. For example, the light emitting function layers of the plurality of light emitting elements in the plurality of sub-pixel regions are configured to emit light of different colors, such as red light, green light, blue light, yellow light, white light, and the like; For example, the light emitting function layers of the plurality of light emitting elements in the plurality of sub-pixel regions are configured to be integrated to emit light of a same color, such as white light, blue light, yellow light or light of other colors.

For example, the pixel driving circuit can be a passive matrix organic light emitting diode (PMOLED) driving circuit or an active matrix organic light emitting diode (AMOLED) driving circuit. For example, the AMOLED driving circuit can include a driving transistor, a data writing transistor, and a storage capacitor, i.e., a 2T1C circuit structure, where T represents a switching element such as a thin film transistor (TFT), and C represents a storage capacitor. According to needs, the AMOLED driving circuit can also be 4T1C, 4T2C or other circuit structures, so as to have a compensation function, a reset function, a light emitting control function, etc. The embodiments of the present disclosure do not limit to the type and specific configuration of the pixel driving circuit.

For example, in the force touch panel provided by at least one embodiment of the present disclosure, the laminated structure can further include a first buffer layer, and the first buffer layer is located between the force sensing layer and the display array layer.

For example, as illustrated in FIGS. 3B and 5, a first buffer layer 231 is disposed on a side of the force touch structure facing the display array layer 210. The first buffer layer 231 can protect the display array layer 210 (e.g., the encapsulation layer 212 therein) from being damaged during the process of manufacturing the force touch structure (e.g., the force sensing layer 220).

For example, the encapsulation layer in the display array layer can be a lamination formed of multi-layer encapsulation films. For example, the encapsulation layer can include a first inorganic encapsulation layer, an organic encapsulation layer, and a second inorganic encapsulation layer sequentially laminated on the light emitting element. The first inorganic encapsulation layer and the second inorganic encapsulation layer have high compactness and can effectively prevent the invasion of external water, oxygen, etc., the organic encapsulation layer has large thickness and certain flexibility, can planarize the surface of the force touch panel and can be used for buffering stress, and the organic encapsulation layer can be filled with materials such as drying agents and the like to absorb the invaded water, oxygen, etc. Therefore, in a case where the thickness of the second inorganic encapsulation layer is limited, the first buffer layer can protect the second inorganic encapsulation layer from being damaged during the process of manufacturing the force sensing layer, thereby protecting the encapsulation effect of the second encapsulation layer and the organic encapsulation layer.

It should be noted that, in a case where the thickness of the second encapsulation layer is sufficient (e.g., not less than 2000 angstroms), the force sensing electrode of the force sensing layer can be directly formed on the surface of the encapsulation layer (e.g., the second encapsulation layer) without providing the first buffer layer.

For example, the material of the first buffer layer 231 can include silicon oxide, silicon nitride, silicon oxynitride, and the like.

For example, in the force touch panel provided by some embodiments of the present disclosure, the force touch structure further includes a first optical adhesive layer, which is located between the touch sensing layer and the force sensing layer. For example, as illustrated in FIG. 6, the touch sensing layer 240 is attached onto the force touch panel using the first optical adhesive layer 251, for example, the touch sensing layer 240 is attached onto a surface of the force sensing layer away from the substrate 100 using the first optical adhesive layer 251.

For example, in at least one embodiment of the present disclosure, a planarization layer can be disposed on a side of the force touch structure away from the substrate to planarize the surface of the force touch panel. The material of the planarization layer can include a resin such as polymethyl methacrylate, polyimide, epoxy resin, polyamide, acrylic acid, etc., or other types of materials.

Figure 6:
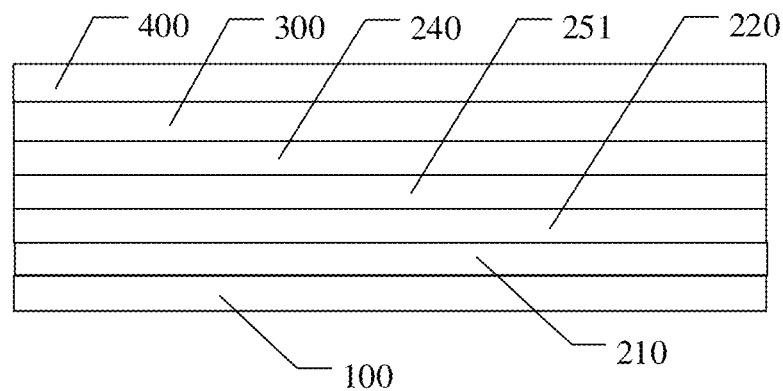
FIG. 6 is a cross-sectional view of further another force touch panel according to some embodiments of the present disclosure.

For example, in at least one embodiment of the present disclosure, as illustrated in FIG. 6, a protective layer 400 can be provided on the force touch panel. The protective layer 400 can serve as an encapsulation cover plate to protect the internal structures (e.g., display array layer, force sensing layer, etc.) of the force touch panel. For example, the protective layer 400 can include a flexible material, so that the force touch panel can be a flexible panel. For example, the material of the protective layer 400 can include one or more selected from the group consisting of polyimide, polycarbonate, polyacrylate, polyetherimide, polyethersulfone, polyethylene terephthalate, polyethylene naphthalate, and the like.

For example, the substrate can include a rigid material or a flexible material, and the flexible material can make the force touch panel a flexible panel. For example, the material of a rigid substrate can include glass, quartz, plastic, etc., and the material of a flexible substrate can include one or more selected from the group consisting of polyimide, polycarbonate, polyacrylate, polyetherimide, polyethersulfone, polyethylene terephthalate, polyethylene naphthalate, etc.

For example, the force touch panel provided by at least one embodiment of the present disclosure further includes a polarization layer, the polarization layer is located on a side of the force sensing layer away from the display array layer, and the polarization layer is configured to reduce reflection of ambient light to improve contrast of a display image of the force touch panel.

For example, as illustrated in FIG. 6, a polarization layer 300 is disposed on a side of the touch sensing layer 240 away from the substrate 100. The polarization layer 300 constitutes a circular polarizer, which includes a linear polarization layer and a quarter-wave plate being laminated. The linear polarization layer is located on the display side, and an axis of the quarter-wave plate forms an angle of 45 degrees with a polarization axis of the linear polarization layer. Therefore, when external light passes through the circular polarizer, it is converted into circularly polarized light. After the circularly polarized light is reflected by electrodes (e.g., electrodes of organic light emitting elements) and the like in the force touch panel, the circularly polarized light is converted into linearly polarized light again when it passes through the quarter-wave plate for the second time, but the polarization direction of the linearly polarized light differs from the polarization axis of the linear polarization layer by 90 degrees, and the linearly polarized light cannot pass through the linear polarization layer. Therefore, the polarization layer 300 can absorb external light incident on the force touch panel, thereby reducing the interference of external ambient light and improving the contrast of the display image of the force touch panel.

For example, in at least one embodiment of the present disclosure, the force touch panel can further include a foam layer. The foam layer can be disposed on the non-display side of the force touch panel, such as a side of the substrate away from the force sensing layer, and abuts against a backplane of a housing of a display device. The foam has a good buffering effect and can protect the force touch panel.

At least one embodiment of the present disclosure provides a display device, which includes the force touch panel according to any one of the above embodiments.

Figure 7:
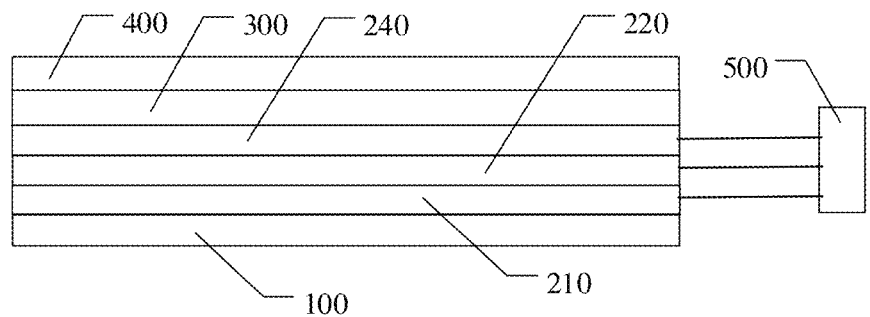
FIG. 7 is a cross-sectional view of a display device according to some embodiments of the present disclosure.

For example, the display device provided by at least one embodiment of the present disclosure further includes a controller, wherein the force sensing layer and the touch sensing layer are in signal connection with the controller, respectively. For example, as illustrated in FIG. 7, the display device includes a controller, such as a chip 500. The chip 500 is in signal connection with the force touch structure by means of bonding, for example, the chip 500 is respectively in signal connection with the electrodes of the force sensing layer 220 and the touch sensing layer 240. For example, the chip 500 can be disposed on a flexible circuit board. For example, the chip 500 is in signal connection with, for example, the pixel driving circuits in the display array layer 210, so as to control the light emitting function of the organic light emitting elements. For example, in combination with the embodiment illustrated in FIG. 3C, in the manufacturing process of the display device, the flexible circuit board provided with the chip can be connected to the contact pads 2117 by using a bonding process, so as to be mounted on the force touch panel.

For example, the chip can be a central processing unit, a digital signal processor, a single chip microcomputer, a programmable logic controller, etc. For example, the chip can further include a memory, a power supply module and the like, and can realize a power supply function and a signal input and output function through additionally arranged wires, signal lines, etc. For example, the chip can further include a hardware circuit, computer executable code, and the like. The hardware circuit can include conventional very large scale integration (VLSI) circuits, or gate arrays and existing semiconductors such as logic chips, transistors, etc., or other discrete components. The hardware circuit can also include field programmable gate arrays, programmable array logic, programmable logic devices, etc.

For example, the display device can be any product or component having a display function, such as a television, a digital camera, a mobile phone, a watch, a tablet computer, a notebook computer, a navigator, etc.

It should be noted that, for the sake of clarity, the present disclosure does not present the entire structure of the display device in at least one embodiment. In order to realize the necessary functions of the display device, those skilled in the art can set other structures (e.g., structures with a touch control function, etc.) according to specific application scenarios, without being limited in the embodiments of the present disclosure.

At least one embodiment of the present disclosure provides a manufacturing method of a force touch panel, which includes: providing a substrate; forming a display array layer on the substrate; and forming a force touch structure on the display array layer, wherein the force touch structure includes a force sensing layer and a touch sensing layer which are laminated, the force sensing layer includes a plurality of force sensing electrodes, each of the plurality of force sensing electrodes is configured to change a resistance value upon being pressed, and the touch sensing layer is configured to detect a touch position. For example, the force touch structure is formed on a surface of the display side of the display array layer. In the manufacturing method provided by some embodiments of the present disclosure, the forming the force touch structure (e.g., a force sensing layer therein) on the surface of the display array layer does not require using an adhesive layer to arrange the force touch structure on the display array layer in an attaching manner, and the force touch structure does not need to be provided with an auxiliary structure (e.g., a substrate for supporting) or the like to adapt to an attaching process, and the design thickness of the force touch structure is small, thereby facilitating the light and thin design of the force touch panel.

For example, in the manufacturing method provided by at least one embodiment of the present disclosure, the forming the display array layer on the substrate includes: forming a light emitting drive circuit layer on the substrate; and forming an encapsulation layer covering the light emitting drive circuit layer. For example, the force touch structure (e.g., the force sensing layer therein) is located on a surface of the encapsulation layer away from the light emitting drive circuit layer. The encapsulation layer can protect the light emitting drive circuit layer, so as to prevent external water, oxygen and the like from invading the interior of the force touch panel and damaging the light emitting drive circuit layer, and the encapsulation layer can planarize the surface of the force touch panel, thereby improving the manufacturing yield of the force sensing layer. For example, in the manufacturing process of the force touch panel, after the encapsulation layer is formed, the force sensing layer is formed on the surface of the encapsulation layer.

The structure of the force touch panel obtained according to the above method can be referred to the relevant descriptions of the embodiments illustrated in FIG. 2, FIGS. 3A to 3H, FIG. 4A, FIG. 4B, FIG. 5 and FIG. 6, and details will not be described herein.

For the present disclosure, the following statements should be noted:

(1) The accompanying drawings involve only the structure(s) in connection with the embodiment(s) of the present disclosure, and other structure(s) can be referred to common design(s).

(2) In case of no conflict, the embodiments of the present disclosure and the features in the embodiments can be combined with each other to obtain new embodiments.

What have been described above are only specific implementations of the present disclosure, the protection scope of the present disclosure is not limited thereto. The protection scope of the present disclosure should be based on the protection scope of the claims.

What is claimed is:

1. A force touch panel, comprising a display array layer and a force touch structure on a display side of the display array layer,
    wherein the force touch structure comprises a force sensing layer and a touch sensing layer, the force sensing layer and the touch sensing layer are laminated on the display array layer,
    the force sensing layer comprises a plurality of force sensing electrodes, each of the plurality of force sensing electrodes is configured to change a resistance value upon being pressed, and the touch sensing layer is configured to detect a touch position;
    each of the plurality of force sensing electrodes is configured to deform upon being pressed, so as to increase the resistance value;
    at least one of the plurality of force sensing electrodes comprises a first sensing sub-electrode and a second sensing sub-electrode electrically connected to each other.

2. The force touch panel according to claim 1, wherein the first sensing sub-electrode and the second sensing sub-electrode are on a same layer and abreast with each other.

3. The force touch panel according to claim 2, wherein the first sensing sub-electrode and the second sensing sub-electrode are arranged in a planar double spiral shape, and
    the first sensing sub-electrode and the second sensing sub-electrode are electrically connected at an intermediate position of the planar double spiral shape.

4. The force touch panel according to claim 1, wherein the force sensing layer further comprises a first insulating layer,
    the first insulating layer is between the first sensing sub-electrode and the second sensing sub-electrode, a first via hole is arranged in the first insulating layer, and the first sensing sub-electrode and the second sensing sub-electrode are electrically connected through the first via hole.

5. The force touch panel according to claim 4, wherein at least one selected from the group consisting of the first sensing sub-electrode and the second sensing sub-electrode has a plane shape of single spiral.

6. The force touch panel according to claim 1, wherein the force sensing layer further comprises a first signal line and a second signal line,
    the first signal line is electrically connected to one end of the first sensing sub-electrode that is not connected to the second sensing sub-electrode, and the second signal line is electrically connected to one end of the second sensing sub-electrode that is not connected to the first sensing sub-electrode.

7. The force touch panel according to claim 1, wherein the display array layer comprises a plurality of sub-pixel regions, and in a direction perpendicular to a plane on which the display array layer is located, at least one of the plurality of force sensing electrodes at least partially overlaps with the plurality of sub-pixel regions;
    each of the plurality of sub-pixel regions comprises a display region and a non-display region around the display region, and an orthographic projection of each of the plurality of force sensing electrodes on the display array layer is in the non-display region.

8. The force touch panel according to claim 1, wherein at least one of the plurality of force sensing electrodes is configured as a grid electrode.

9. The force touch panel according to claim 1, wherein the display array layer comprises a plurality of light emitting elements and an encapsulation layer, the encapsulation layer is between the plurality of light emitting elements and the force touch structure, and the force touch structure is on a surface of the encapsulation layer away from the plurality of light emitting elements.

10. A display device, comprising the force touch panel according to claim 1.

11. The display device according to claim 10, further comprising a controller, wherein the force sensing layer and the touch sensing layer are respectively connected to the controller in signal connection.

12. A force touch panel, comprising a display array layer and a force touch structure on a display side of the display array layer,
    wherein the force touch structure comprises a force sensing layer and a touch sensing layer, the force sensing layer and the touch sensing layer are laminated on the display array layer,
    the force sensing layer comprises a plurality of force sensing electrodes, each of the plurality of force sensing electrodes is configured to change a resistance value upon being pressed, and the touch sensing layer is configured to detect a touch position;
    each of the plurality of force sensing electrodes is configured to deform upon being pressed, so as to increase the resistance value;
    wherein a plane shape of at least one of the plurality of force sensing electrodes comprises a wave shape, the force sensing layer further comprises a first signal line and a second signal line, and the first signal line and the second signal line are respectively electrically connected to both ends of the at least one of the plurality of force sensing electrodes; or,
    the plane shape of at least one of the plurality of force sensing electrodes comprises a single spiral shape, and the force sensing layer further comprises a first signal line, a second signal line and a second insulating layer, the second insulating layer is between the at least one of the plurality of force sensing electrodes and the second signal line, the first signal line is electrically connected to an outer end of the at least one of the plurality of force sensing electrodes, a second via hole is arranged in the second insulating layer, and the second signal line is electrically connected to an inner end of the at least one of the plurality of force sensing electrodes through the second via hole.

13. A force touch structure, comprising:
   a force sensing layer, comprising a plurality of force sensing electrodes, each of the plurality of force sensing electrodes being configured to change a resistance value upon being pressed; and
   a touch sensing layer on the force sensing layer, the touch sensing layer being configured to detect a touch position,
   wherein each of the plurality of force sensing electrodes is configured to deform upon being pressed, so as to increase the resistance value,
   at least one of the plurality of force sensing electrodes comprises a first sensing sub-electrode and a second sensing sub-electrode electrically connected to each other, and the first sensing sub-electrode and the second sensing sub-electrode are on a same layer and abreast with each other.

14. The force touch structure according to claim 13, wherein
   the first sensing sub-electrode and the second sensing sub-electrode are arranged in a planar double spiral shape, and
   the first sensing sub-electrode and the second sensing sub-electrode are electrically connected at an intermediate position of the planar double spiral.

15. The force touch structure according to claim 13, wherein the force sensing layer comprises a first sensing sub-electrode, a first insulating layer and a second sensing sub-electrode, the first insulating layer is between the first sensing sub-electrode and the second sensing sub-electrode, a first via hole is arranged in the first insulating layer, and the first sensing sub-electrode and the second sensing sub-electrode are electrically connected through the first via hole.

* * * * *

UNITED STATES PATENT AND TRADEMARK OFFICE
CERTIFICATE OF CORRECTION

| | | |
|---|---|---|
| PATENT NO. | : 11,112,898 B2 | Page 1 of 1 |
| APPLICATION NO. | : 16/633621 | |
| DATED | : September 7, 2021 | |
| INVENTOR(S) | : Qing Gong | |

It is certified that error appears in the above-identified patent and that said Letters Patent is hereby corrected as shown below:

On the Title Page

Item [73], should read: CHENGDU BOE OPTOELECTRONICS TECHNOLOGY CO., LTD. Chengdu (CN); BOE TECHNOLOGY GROUP CO., LTD., Beijing (CN)

Signed and Sealed this
Eleventh Day of March, 2025

Coke Morgan Stewart
*Acting Director of the United States Patent and Trademark Office*